(12) United States Patent
Kajiyama et al.

(10) Patent No.: US 7,858,530 B2
(45) Date of Patent: Dec. 28, 2010

(54) PROCESSING METHOD FOR WAFER AND PROCESSING APPARATUS THEREFOR

(75) Inventors: Keiichi Kajiyama, Tokyo (JP); Takatoshi Masuda, Tokyo (JP)

(73) Assignee: Disco Corporation (JP)

( * ) Notice: Subject to any disclaimer, the term of this patent is extended or adjusted under 35 U.S.C. 154(b) by 820 days.

(21) Appl. No.: 11/728,936

(22) Filed: Mar. 27, 2007

(65) Prior Publication Data

US 2007/0227655 A1   Oct. 4, 2007

(30) Foreign Application Priority Data

Mar. 29, 2006   (JP)   .............................. 2006-090235

(51) Int. Cl.
*H01L 21/302* (2006.01)
*C03C 25/68* (2006.01)

(52) U.S. Cl. ......................................... 438/716; 216/52

(58) Field of Classification Search ................ 438/716, 438/690, 745; 216/52; 156/345.11
See application file for complete search history.

(56) References Cited

U.S. PATENT DOCUMENTS

| | | | |
|---|---|---|---|
| 6,527,627 B2 * | 3/2003 | Arai | 451/41 |
| 2005/0070072 A1 * | 3/2005 | Priewasser | 438/460 |
| 2005/0250295 A1 | 11/2005 | Mita | |
| 2006/0244096 A1 * | 11/2006 | Sekiya | 257/510 |

FOREIGN PATENT DOCUMENTS

| | | |
|---|---|---|
| JP | 10-233431 | 9/1998 |
| JP | 2002-299196 | 10/2002 |
| JP | 2004-281551 | 10/2004 |
| JP | 2005-123425 | 5/2005 |

OTHER PUBLICATIONS

Office Action issued in corresponding Japanese Patent Application No. 2006-090235; issued Aug. 13, 2010 (3 pages).

* cited by examiner

*Primary Examiner*—Binh X Tran
*Assistant Examiner*—Patti Lin
(74) *Attorney, Agent, or Firm*—Brinks Hofer Gilson & Lione

(57) ABSTRACT

A processing method for a wafer includes: preparing a wafer which has a device region having plural devices formed on a surface of the wafer; and a peripheral reinforcing portion which is integrally formed around the device region and has a projection projecting outwardly on a rear surface of the wafer. The processing method further includes: removing at least the projection of the peripheral reinforcing portion of the wafer; and transferring the wafer after the removing. In the removing, while the wafer is held on a holding table such that the rear surface of the wafer is exposed and the surface of the wafer closely contacts the holding table, at least the projection of the peripheral reinforcing portion is removed. After the removing of at least the projection, while the wafer is held on the holding table, a holding tape is applied to the rear surface of the wafer and the holding tape is supported by a frame. In the transferring, the wafer having the holding tape applied thereon is separated together with the frame from the holding table and is transferred together with the frame.

4 Claims, 10 Drawing Sheets

PROCESSING METHOD FOR WAFER AND PROCESSING APPARATUS THEREFOR

This application claims priority under 35 U.S.C. §119 to Japanese Patent Application No. JP2006-090235 filed Mar. 29, 2006, the entire content of which is hereby incorporated by reference.

BACKGROUND OF THE INVENTION

1. Field of the Invention

The present invention relates to a processing method and to a processing apparatus in which a thick peripheral reinforcing portion of a wafer (for example, a semiconductor wafer), which is formed around a region of the wafer having devices (for example, semiconductor chips) formed thereon, is removed from the wafer and the wafer is transferred to a next process.

2. Description of Related Art

In general, semiconductor chips, which are used in various electronic apparatuses, are produced by the following method. That is, grid-like rectangular regions are defined by predetermined division lines on a disc-shaped semiconductor wafer, and electronic circuits are formed on surfaces of the rectangular regions. Next, a rear surface of the wafer is ground so as to be thinned. The wafer is divided along the predetermined division lines. As a result, semiconductor chips are produced. In recent years, electronic apparatuses have been greatly improved in compactness and thinness. In accordance with this, semiconductor chips are required to be even thinner, and semiconductor wafers are required to be thinner than previously.

When a semiconductor wafer is thinned, the rigidity of the semiconductor wafer is decreased. Due to this, it is difficult to handle the semiconductor wafer after the thinning, and cracking easily occurs in the semiconductor wafer. In order to solve these problems caused by the thinning, only the rear surface of circular device region, which has semiconductor chips formed on the surface, is ground so as to be thinned, and a ring-shaped peripheral extra region around the device region is thereby formed as a relatively thick reinforcing portion. In this case, since the rear surface is ground, the thick peripheral reinforcing portion projects on the rear surface and the entire semiconductor wafer has a recessed shape in cross section. The technique, in which only the peripheral portion is allowed to be thick, has been disclosed in Japanese Unexamined Patent Applications Publication Nos. 2004-281551 and 2005-123425.

In conventional techniques, in order to easily handle a thinned semiconductor wafer, a protective tape was applied to a surface of the semiconductor wafer so as to provide rigidity thereto. However, when a metal film composed of gold is provided by a method (for example, deposition or sputtering) on a rear surface of the semiconductor wafer after thinning, the protective tape has insufficient heat-resistance, so that the processing temperature needed to be lower. Due to this, processing is more time-consuming in this case than in normal cases. In contrast, in the above rigidity improvement technique by formation of a peripheral reinforcing portion, since the rigidity is maintained even when the protective tape is peeled from the semiconductor wafer after the thinning, the above rigidity improvement technique by formation of a peripheral reinforcing portion is superior in that deposition or sputtering can be performed without consideration of heat effects.

In the above manner, the semiconductor wafer is finally divided into plural semiconductor chips. In this case, a typical dividing method for semiconductor wafer is a method in which a semiconductor wafer, which is chucked and held on a vacuum chuck-type table, is cut off by a cutting blade. In this method, a rear surface of the semiconductor wafer is applied to and supported by an adhesive surface of a dicing tape which is provided to a ring-shaped dicing frame, and the dicing tape is chucked on the chuck table. As a result, the semiconductor wafer is supported by the chuck table.

In this case, if the semiconductor wafer has a typical plate shape, the entire rear surface of the semiconductor wafer closely contacts the chuck table, so that the semiconductor wafer is stably held. However, when the semiconductor wafer has the above peripheral reinforcing portion, it is difficult to stably hold the semiconductor wafer. In order to solve this problem, it was conceived that the chuck table could be modified to have a shape to which the recessed rear surface of the semiconductor wafer having the above peripheral reinforcing portion is fitted. However, since this modification of the chuck table is not practical, the above peripheral reinforcing portion of the semiconductor wafer is removed, so that the entire semiconductor wafer is processed to have a plate shape.

In order to remove a peripheral reinforcing portion, for example, there are the following methods. In one method, a cutting blade cuts a boundary between a peripheral reinforcing portion and a device region, and it cuts off the peripheral reinforcing portion. In the other method, a peripheral reinforcing portion is ground by a grinding stone or a cutting blade. The wafer after the removal of the peripheral reinforcing portion is transferred to a process in which the wafer is cut off and divided into semiconductor chips in the above manner. However, in this case, since the peripheral reinforcing portion of the wafer is removed, the rigidity of the wafer is low and damage (for example, cracking) easily occurs in the wafer. Due to this, when the wafer is transferred from the removal process for removing the peripheral reinforcing portion to the dividing process for dividing of wafer into semiconductor chips, a method for reliably transferring of the wafer without damage occurring in the wafer is required.

SUMMARY OF THE INVENTION

Therefore, an object of the present invention is to provide a processing method and a processing apparatus which can reliably transfer a wafer from a process for removing a peripheral reinforcing portion of the wafer to a process for dividing of the wafer into devices (for example, semiconductor chips) without damage occurring in the wafer.

According to one aspect of the present invention, a processing method for a wafer includes: preparing a wafer which has a device region having plural devices formed on a surface of the wafer; and a peripheral reinforcing portion which is integrally formed around the device region and has a projection projecting outwardly on a rear surface of the wafer. The processing method further includes: removing at least the projection of the peripheral reinforcing portion of the wafer; and transferring the wafer after the removing. In the removing, while the wafer is held on a holding table such that the rear surface of the wafer is exposed and the surface of the wafer closely contacts the holding table, at least the projection of the peripheral reinforcing portion is removed. After the removing of at least the projection, while the wafer is held on the holding table, a holding tape is applied to the rear surface of the wafer and the holding tape is supported by a frame. In the transferring, the wafer having the holding tape applied thereon is separated together with the frame from the holding table and is transferred together with the frame.

In the processing method of the present invention, after a necessary portion (at least the projection) of the peripheral reinforcing portion is removed, in order to transfer the wafer to a next process, while the wafer is not separated from the holding table and the wafer is held on the holding table, the holding tape supported by the frame is applied onto the rear surface of the wafer. Since the holding tape is applied on the wafer, the wafer can be transferred to the next process via the frame without contacting the wafer directly by handing device. Therefore, the wafer, which is thinned by the removal of the peripheral reinforcing portion and may not be thereby easily handled, can be reliably transferred without damage thereto.

In one method for providing the frame, the holding tape which will be applied on the wafer, and the frame for supporting the holding tape may be separated from each other. First, the holding tape may be applied on the wafer, and then the frame may be applied on the holding tape, so that the holding tape can be supported by the frame. The frame may be ring-shaped, and the wafer may be supported inside the frame via the holding tape. This feature may be practical. In this feature, the wafer may be disposed inside the frame, and the wafer and the frame may be positioned on the same surface. The holding tape may be applied on the wafer and the frame, so that the wafer and the frame can be simultaneously applied on the holding tape. In this case, in order that the wafer may be disposed inside the frame, and the wafer and the frame may be easily positioned on the same surface, the size relationship may be desirable such that the frame can be mounted on the holding table.

In the wafer of which the projection of the peripheral reinforcing portion will be removed in the above processing method of the present invention, the rigidity can be secured by the peripheral reinforcing portion, so that the handleability and the durability can be improved. Therefore, since heat due to deposition, sputtering, or the like cause no problem, a metal film may be provided to a region of the rear surface which corresponds to the device region.

When at least the projection of the peripheral reinforcing portion is removed, ground waste or the like may be generated, and may be adhered to the rear surface of the wafer. Thus, if the holding tape is applied on the rear surface in the above condition of the wafer, the following problem may be caused when the wafer is divided into devices in a process after the transferring. That is, since the holding tape closely contacts the holding table, the surface of the wafer is cut, and the wafer is divided into devices, the wafer cannot closely contact the holding table and cannot be held thereby due to the ground waste which is adhered to the rear surface of the wafer and exists in the holding tape. As a result, the wafer may be rickety, so that the wafer cannot be reliably cut. In order to solve this problem, after the peripheral reinforcing portion is removed, the wafer may be subjected to the cleaning while the wafer is held on the holding table. After the cleaning, the holding tape may be applied to the rears surface of the wafer, so that the above problem can be prevented.

According to another aspect of the present invention, a processing apparatus for a wafer is provided. The wafer includes: a device region which has plural devices formed on a surface of the wafer; and a peripheral reinforcing portion which is integrally formed around the device region and has a projection projecting outwardly on a rear surface of the wafer. The processing apparatus includes: a holding table for holding the wafer while the rear surface of the wafer is exposed and the surface of the wafer closely contacts the holding table; a peripheral reinforcing portion removing device for removing at least the projection of the peripheral reinforcing portion of the wafer; and a holding tape applying device for applying a holding tape to the rear surface of the wafer and supporting the holding tape by a frame. After at least the projection of the peripheral reinforcing portion is removed by the peripheral reinforcing portion removing device, the wafer on which the holding tape is applied by the holding tape applying device is transferred together with the frame.

According to a preferred embodiment of the present invention, the processing apparatus further includes: a cleaning device for cleaning the wafer, of which at least the projection of the peripheral reinforcing portion is removed, while the wafer is held on the holding table.

In the present invention, after a necessary portion (at least the projection) of the peripheral reinforcing portion is removed, in order to transfer the wafer to a next process, while the wafer is not separated from the holding table and the wafer is held on the holding table, the holding tape supported by the frame is applied onto the rear surface of the wafer, and the wafer is transferred to the next process via the frame. Therefore, the wafer, which is thinned by the removal of the peripheral reinforcing portion and may not be thereby easily handled, can be reliably transferred without damage thereto.

DETAILED DESCRIPTION OF THE PREFERRED EMBODIMENTS

An embodiment of the present invention will be explained hereinafter with reference to the drawings.

1. Semiconductor Wafer

Figure 1A:
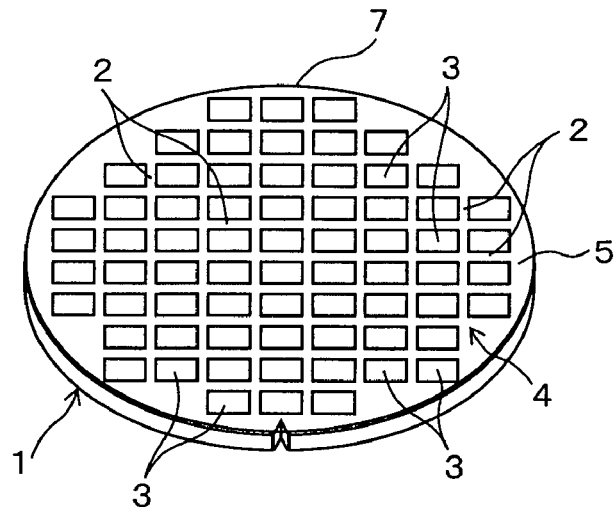
FIGS. 1A to 1C are a surface side perspective view, a rear surface side perspective view, and a cross sectional view which show a wafer processed in an embodiment according to the present invention.
Figure 1B:
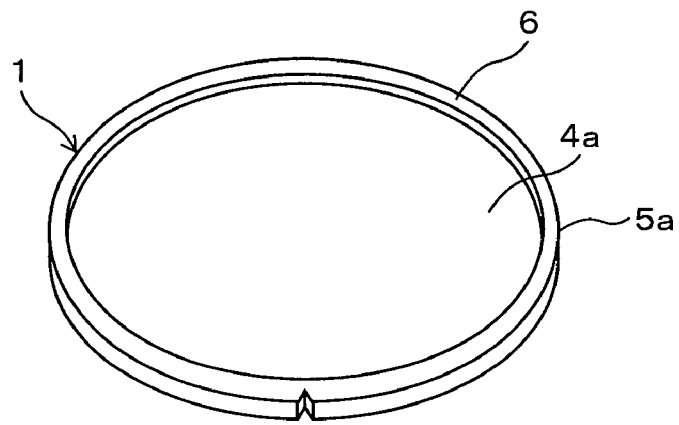
Figure 1C:
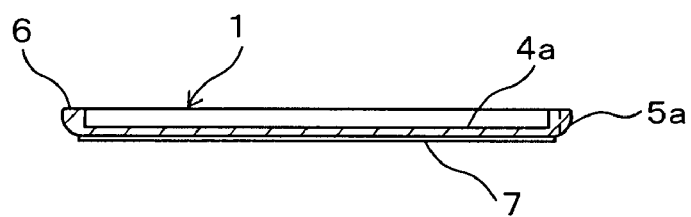

In FIGS. 1A to 1C, reference numeral 1 denotes a disc-shaped semiconductor wafer (hereinafter referred to simply as "wafer") which is processed in the embodiment. The wafer 1 is a silicon wafer or the like. As shown in FIG. 1A, grid-like predetermined division lines 2 are formed on a surface of the wafer 1, and plural rectangular semiconductor chips 3 are defined by the predetermined division lines 2 on the surface of the wafer 1. Electronic circuits (for example, Integrated Circuits (ICs) and Large Scale Integrations (LSIs)), which are not shown in FIGS. 1A to 1C, are formed on surfaces of the semiconductor chips 3. The plural semiconductor chips 3 are formed on a device region 4 which is almost circular so as to be concentric with the wafer 1. A ring-shaped peripheral extra region 5, which has no semiconductor chip 3 formed thereon, is formed around the device region 4.

FIGS. 1B and 1C are views in which a rear surface of the wafer 1 faces upward. As shown in FIGS. 1B and 1C, the rear surface of the wafer 1 has a ring-shaped peripheral edge portion (hereinafter referred to simply as "ring-shaped projection 6") which projects thereon. A recess 4a is formed inside the ring-shaped projection 6. A portion of the rear surface which corresponds to the device region 4 is ground and removed by a grinding stone or the like, so that the recess 4a is formed. The peripheral extra region 5 is not ground and remains as it is, and it is thereby used as a peripheral reinforcing portion 5a. The peripheral reinforcing portion 5a has the ring-shaped projection 6 projecting on the rear surface of the wafer 1. For example, in the wafer 1, the peripheral reinforcing portion 5a has a thickness of about 600 µm. For example, the device region 4 which is thinned by formation of the recess 4a has a thickness of about 50 to 100 µm.

The wafer 1 may have a metal film on a region of the rear surface corresponding to the device region 4, that is, a bottom of the recess 4a. For example, the metal film is composed of Au and is formed by a method (for example, deposition or sputtering). The wafer 1 may be subjected to a predetermined heating process for ion implantation from the rear surface of the wafer 1. As shown in FIGS. 1A to 1C, a protective tape 7 for protecting the electronic circuits of the semiconductor chips is applied on the surface of the wafer 1. Next, this wafer 1 is transferred to the following processing.

2. Wafer Processing Apparatus

A wafer processing apparatus will be explained hereinafter with reference to FIGS. 2 to 9C. The wafer processing apparatus performs processing in which the ring-shaped projection 6 of the peripheral reinforcing portion 5a of the wafer 1 is removed and the wafer 1 is transferred to next processes.

Figure 2:
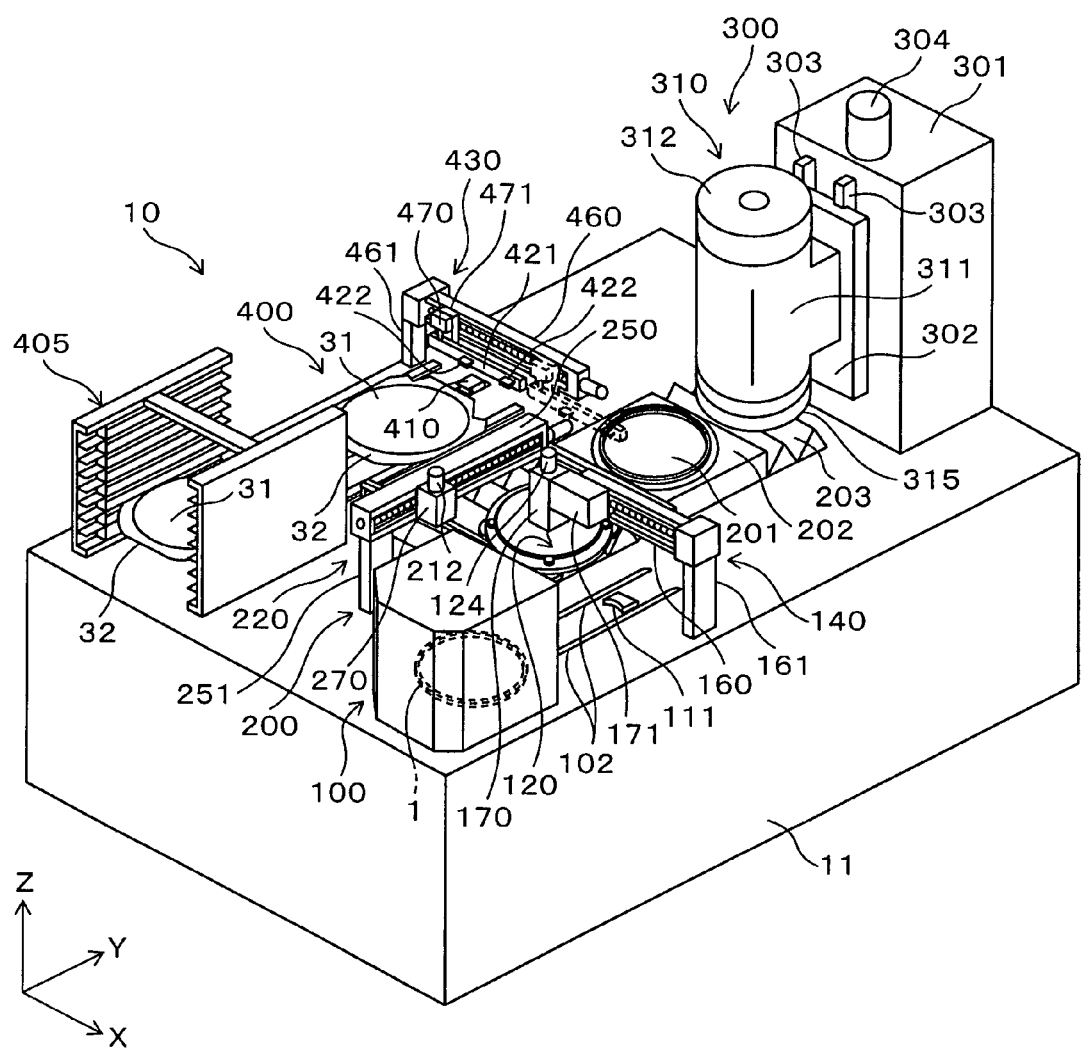
FIG. 2 is an overall perspective view of a wafer processing apparatus of an embodiment according to the present invention.
Figure 3:
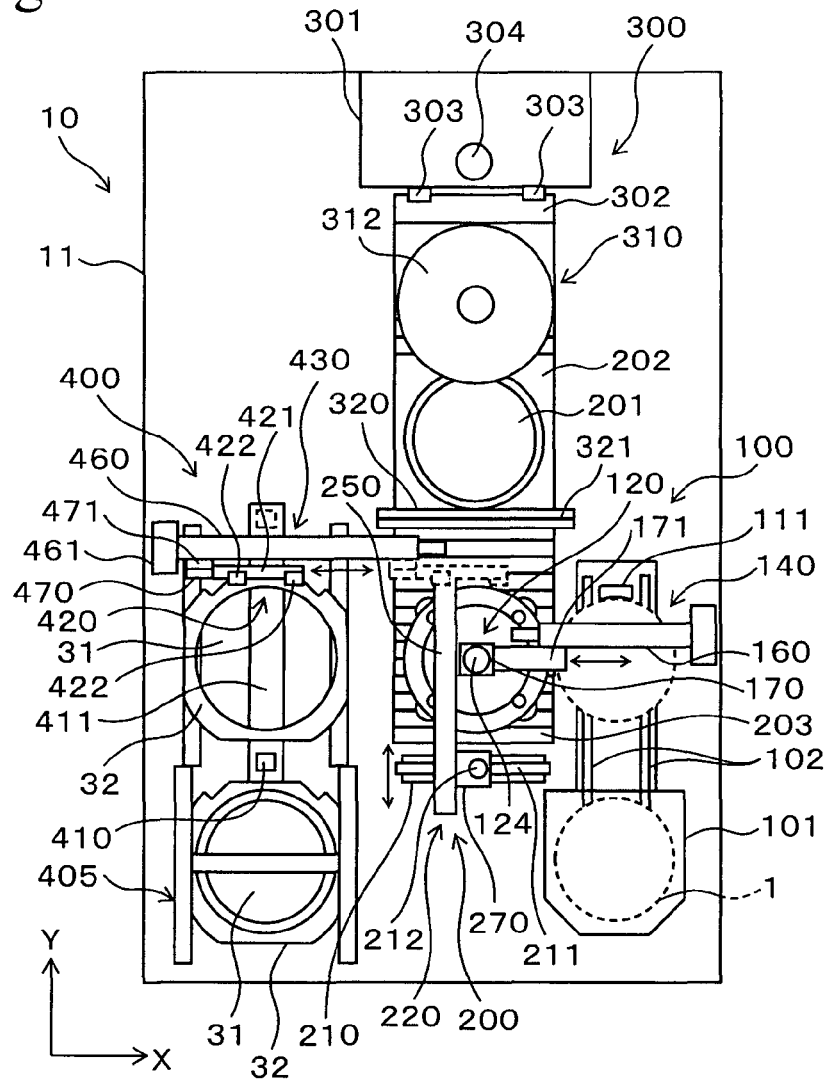
FIG. 3 is a plan view of the wafer processing apparatus shown in FIG. 2.

FIGS. 2 and 3 are a perspective view and a plan view which show a wafer processing apparatus 10. The processing apparatus 10 is equipped with a pedestal 11. On a front side (lower side in FIG. 3) of the Y direction on the pedestal 11, a wafer supply section 100, a dicing tape applying section (holding tape applying device) 200, and a dicing tape carrying section 400 are provided in turn from the right side to the left side in the X direction shown in FIG. 3. On a back side (upper side in FIG. 3) of the dicing tape applying section 200 in the Y direction, a wafer grinding section 300 is provided. The wafer 1 is moved once from the wafer supply section 100 to the dicing tape applying section 200. Next, the wafer 1 is moved to the wafer grinding section 300, and at least the ring-shaped projection 6 of the peripheral reinforcing portion 5a is ground by the wafer grinding section 300. Next, the wafer 1 is returned to the dicing tape applying section 200. In the dicing tape applying section 200, a dicing tape, which is moved from the dicing tape carrying section 400, is applied to the wafer 1. These sections will be explained hereinafter.

2-a. Wafer Supply Section

The wafer supply section 100 is equipped with a wafer carrier 101, a pair of carrying belts 102, a stopper 111, a wafer hand 120, and a wafer hand driving mechanism 140. The wafer carrier 101 is disposed at the front side of the Y direction on the pedestal 11. The carrying belts 102 extend from the wafer carrier 101 to the back side of the Y direction. The stopper 111 is provided at a downstream end portion (upper end portion in FIG. 3) disposed between the carrying belts 102. The wafer hand 120 picks up a wafer 1 and carries it to the dicing tape applying section 200. The wafer hand driving mechanism 140 moves the wafer hand 120 in the X and Z directions.

Plural wafers 1 are provided in the wafer carrier 101 so as to be stored horizontally such that rear surfaces of the wafers 1 face upward. The wafer carrier 101 has an elevating mechanism therein. The wafer carrier 101 moves wafers 1, which are provided therein, vertically by one step by using the elevating mechanism. The wafer 1 moved to the lowest step by the elevating mechanism is mounted on the carrying belts 102, and it is moved by the carrying belts 102 so as to abut the stopper 111.

Figure 4:
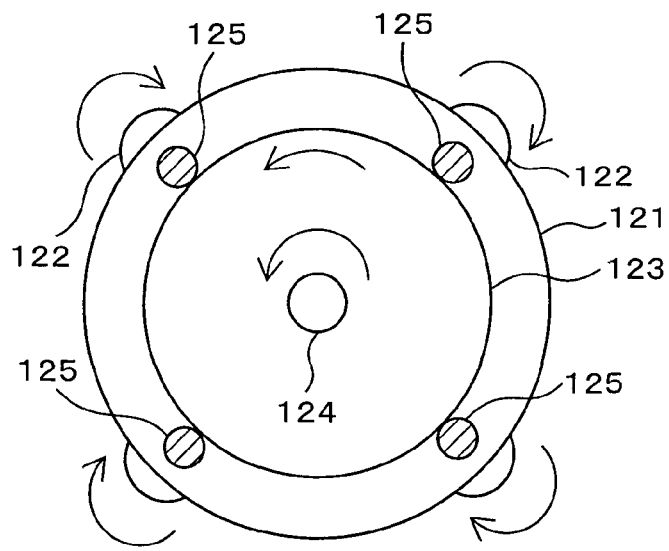
FIG. 4 is a plan view which shows a wafer hand of wafer supply section of the wafer processing apparatus.
Figure 5A:
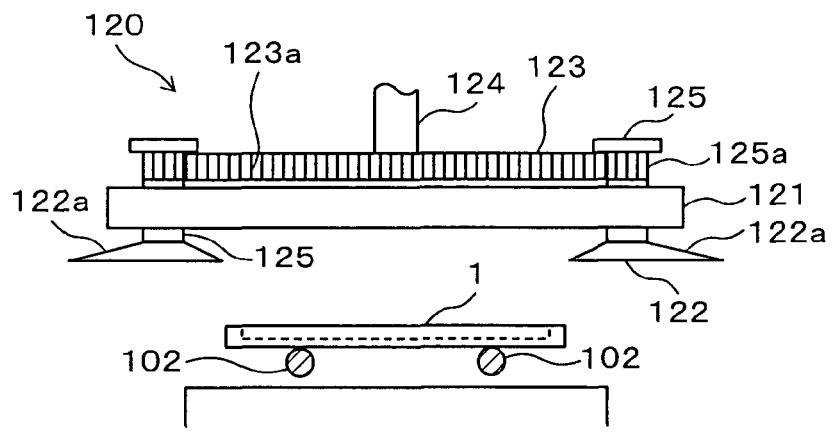
FIGS. 5A to 5D are side views which show actions of the wafer hand in turn.
Figure 5B:
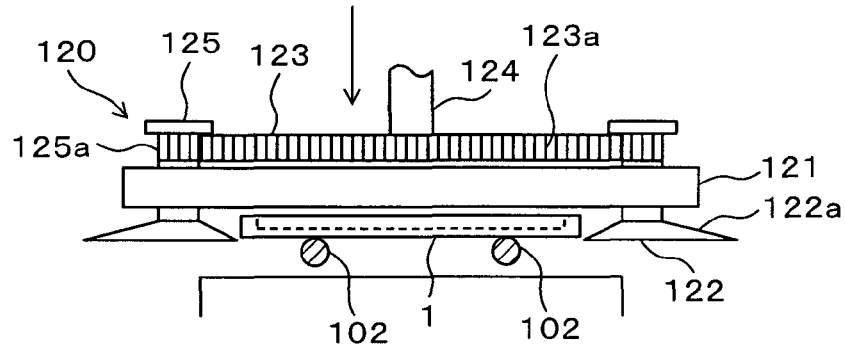
Figure 5C:
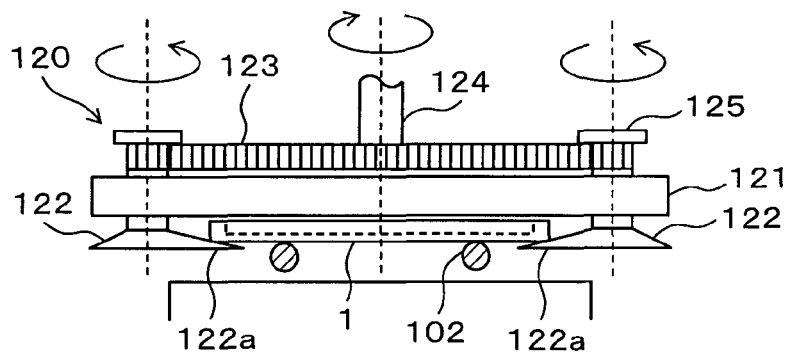
Figure 5D:
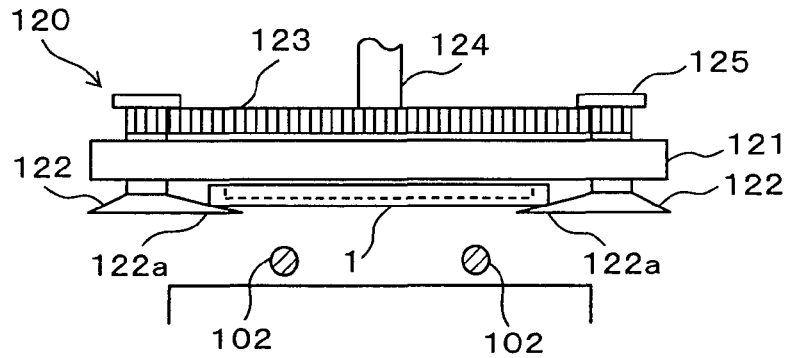

As shown in FIGS. 4 to 5D, the wafer hand 120 is equipped with a disc-shaped base 121, plural hand picks 122, a disc-shaped gear plate 123, and a hand shaft 124. The hand picks 122 are provided on the base 121. The gear plate 123 is disposed above the base 121. The hand shaft 124 is secured at the center of the gear plate 123 and extends upward. Plural (in the embodiment, four) pick shafts 125 which extend in the Z direction (vertical direction) are provided at a circumferential portion of the base 121 so as to be equally spaced from each other. The pick shafts 125 penetrate the circumferential portion so as to be rotatable and so as not to be movable in the axial direction. The hand picks 122 are provided at end portions of the pick shafts 125 which project downwardly from the base 121. The hand picks 122 are relatively flat conical so as to broaden outwardly in the lower direction.

On the other hand, gear portions 125a are formed at end portions of the pick shafts 125 which project upwardly from the base 121. Gear portions 123a, which are formed on a peripheral surface of the gear plate 123, mesh with the gear portions 125a of the pick shafts 125. The gear plate 123 and the pick shafts 125 are concentric with the hand shaft 124. When the gear plate 123 rotates together with the hand shaft 124 in one direction, the rotation thereof is transmitted to each pick shaft 125 via the gear portions 123a and 125a, and the hand pick 122 rotates in cooperation therewith.

Each hand pick 122 has a teardrop shape in plan view. The hand picks 122 are provided on the pick shafts 125 such that leading end portions 122a of all hand picks 122, which are sharply angled, face the rotational axis of the hand shaft 124 when they are positioned at a predetermined rotation angle. When the leading end portions 122a of all hand picks 122 face the rotational axis of the hand shaft 124 in the above manner, as shown in FIG. 5C, the wafer 1 can be received on the leading end portions 122a of the hand picks 122. As shown in FIG. 5B, when the hand picks 122 are rotated by about 180 degrees from the above pick-up positions, the wafer 1 cannot be received on the hand picks 122, so that the wafer 1 can pass through the inside of each hand pick 122.

As shown in FIGS. 2 and 3, the hand shaft 124 of the wafer hand 120 is rotatably and elevatably supported by a Z axis driving mechanism 170 of the wafer hand driving mechanism 140. In the Z axis driving mechanism 170, a driving mechanism for rotating and vertically elevating of the hand shaft 124 is provided. The wafer hand driving mechanism 140 has an X axis driving mechanism 160 and the Z axis driving mechanism 170. The X axis driving mechanism 160 is provided so as to cross above the carrying belts 102 in the X direction at a position which is almost in front of the stopper 111. The Z axis driving mechanism 170 engages with the X axis driving mechanism 160 via a base block 171. The X axis driving mechanism 160 is a screw rod type driving mechanism. The X axis driving mechanism 160 is secured at an upper end of column 161 which stands on the pedestal 11. The X axis driving mechanism 160 moves the Z axis driving mechanism 170 in the X direction. The wafer hand 120 is moved in the X and Z directions by the X axis driving mechanism 160 and the Z axis driving mechanism 170. Next, the wafer hand 120 picks up the wafer 1 which is carried by the carrying belts 102 and is stopped by the stopper 111, and it moves the wafer 1 to the dicing tape applying section 200.

2-b. Dicing Tape Applying Section

Figure 8A:
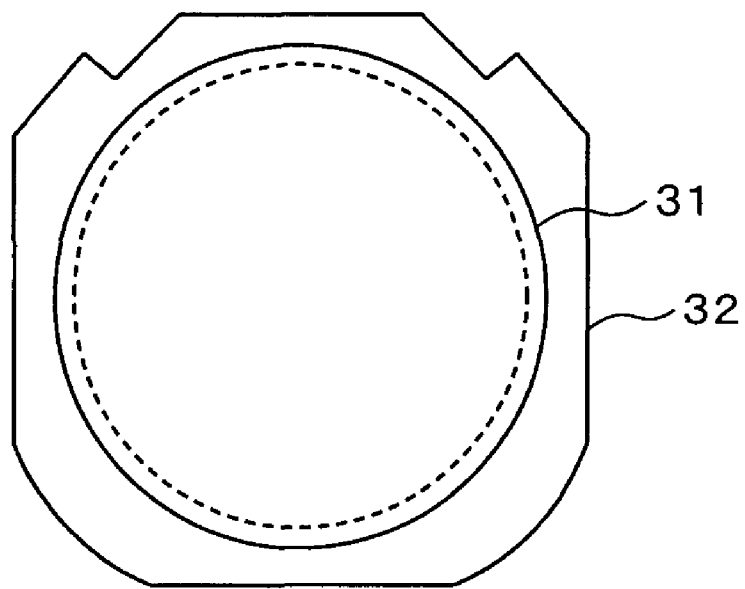
FIGS. 8A and 8B are a plan view and a cross sectional view which show a dicing tape and a dicing frame.
Figure 8B:
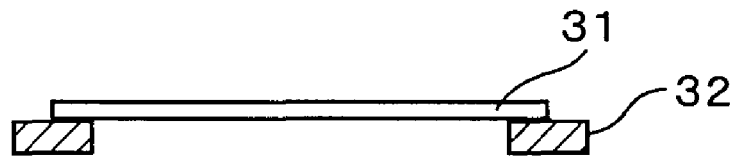

A position proximate to the left side of the wafer 1, which is moved by the carrying belts 102 and is stopped by the stopper 111, with respect to the Y direction is set as a wafer setting position. The dicing tape applying section 200 is equipped with a disc-shaped chuck table (holding table) 201, a pressing roller 210, and a roller driving mechanism 220. The chuck table 201 is disposed at the wafer setting position. The pressing roller 210 moves so as to cross above the chuck table 201, which is on the wafer setting position, in the Y direction, thereby pressing and applying a dicing tape (holding tape) 31, which is shown in FIGS. 8A and 8B, on a rear surface of the wafer 1. The roller driving mechanism 220 moves the pressing roller 210 in the Y and Z directions.

The chuck table 201 is a typical vacuum chuck type table, and it is rotated around a rotation axis, which is a rotation center, by a rotating mechanism which is not shown in the drawings. The chuck table 201 chucks, holds, and rotates the wafer 1 which is mounted on a flat upper surface by a vacuum action. The chuck table 201 is rotatably supported by a table base 202 which is reciprocated in the Y direction. A cornice-shaped cover 203 for preventing intrusion of dust and waste is stretchably provided on both sides of the moving direction of the table base 202 so as to cover the moving path of the table base 202.

The chuck table 201 is reciprocated between the wafer setting position and a wafer grinding position by the moving of the table base 202 in the Y direction. The wafer grinding position is a position for grinding and removing the peripheral reinforcing portion 5a of the wafer 1 by using the wafer grinding section 300. The wafer 1 which is stopped by the stopper 111 is mounted to the chuck table 201, which is positioned at the setting position, by the wafer hand 120.

The pressing roller 210 has a surface composed of elastic body (for example, rubber) which is appropriately elastic. The pressing roller 210 is rotatably supported by an X direction rotation shaft of roller frame 211. The roller frame 211 is elevatably supported by a Z axis driving mechanism 270 of the roller driving mechanism 220 via a shaft 212 which extends in the Z direction. The Z axis driving mechanism 270 has an elevating mechanism therein. The elevating mechanism elevates the shaft 212 and the pressing roller 210.

The roller driving mechanism 220 is equipped with a Y axis driving mechanism 250 and the Z axis driving mechanism 270. The Y axis driving mechanism 250 is supported by a column 251, which stands on the pedestal 11, in a cantilever manner. In this case, the Y axis driving mechanism 250 is provided so as to cross above the chuck table 201, which is positioned at the setting position, in the Y direction. The Z axis driving mechanism 270 is provided so as to engage with the Y axis driving mechanism 250 and to extend in the Z direction. The Y axis driving mechanism 250 is a screw rod type driving mechanism and acts so as to move the Z axis driving mechanism 270 in the Y direction. The pressing roller 210 is reciprocated on the chuck table 201, which is positioned at the setting position, in the Y direction by the Y axis driving mechanism 250. The pressing roller 210 is elevated by the Z axis driving mechanism 270.

2-c. Wafer Grinding Section

The wafer grinding section 300 has a column 301 and a grinding unit 310 (peripheral reinforcing portion removing device). The column 310 stands on the pedestal 11 on which the chuck table 201 positioned at the setting position is moved to the back side of the Y direction by the table base 202. The grinding unit 310 is provided on the front side surface of the column 301. The grinding unit 310 is provided via the slide plate 302 and the guide rail 303 so as to be elevatable in the Z direction. The grinding unit 310 is elevated by an elevating mechanism 304.

Figure 6:
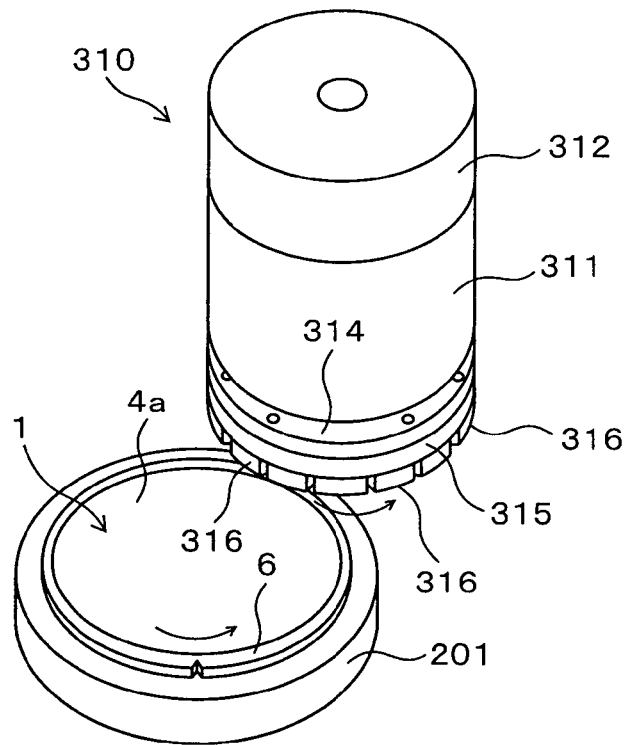
FIG. 6 is a perspective view which shows a condition in which a peripheral reinforcing portion of the wafer is ground by a grinding unit of wafer grinding section.
Figure 7:
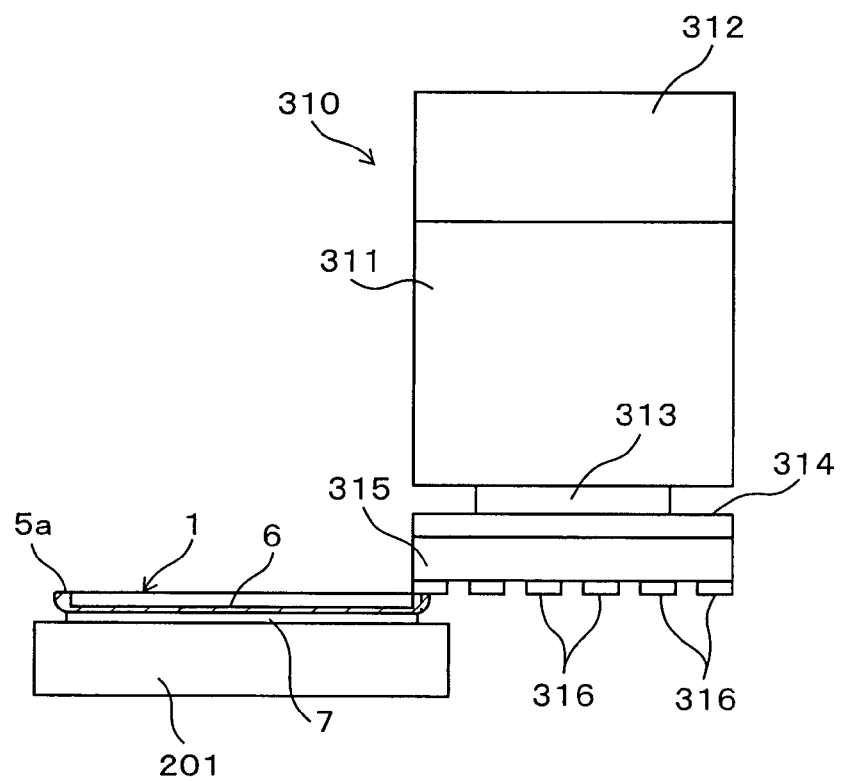
FIG. 7 is a side view of FIG. 6.

As shown in FIGS. 6 and 7, the grinding unit 310 is equipped with a cylindrical spindle housing 311, a motor 312, a spindle 313, a flange 314, a cup wheel 315, and plural grinding stones 316. The spindle housing 311 is secured on a slide plate so as to have an axis extending in the Z direction. The spindle 313 is assembled in the spindle housing 311 so as to have the same axis as that of the spindle housing 311. The spindle 313 has an end portion projecting from the lower end portion of the spindle housing 311. The spindle 311 is rotated by the motor 312. The cup wheel 315 is secured at the projecting end portion of the spindle 313 via the flange 314. The grinding stones 316 are arranged and secured at an overall circumference of a circumferential portion on a lower surface of the cup wheel 315 so as to have a ring-shaped form. The spindle 313, which is a rotation driving shaft of the cup wheel 315, extends in the Z direction so as to be parallel to the rotation axis of the chuck table 201. The grinding unit 310 is gradually moved downwardly by the elevating mechanism 304, and presses the grinding stones 316 on a work, thereby grinding the work. In this case, an outer diameter of circular grinding locus of the grinding stones 316 is almost equal to a diameter of the wafer 1 which is the work.

As shown in FIG. 3, the position of the grinding unit 310 in the X direction is set such that a line connecting the rotation axis of the spindle 313 and the rotation axis of the chuck table 201 is parallel to the Y direction. The position of the grinding unit 310 in the Y direction is eccentric and offset toward the back side (the side of the column 301) from the chuck table 201 positioned at the grinding position. The cup wheel 315 has a grinding water supply opening through which grinding water for cooling, lubricating, and discharging ground waste is supplied onto a processed point of the work positioned thereunder. The grinding unit 310 has a water supply line, which is used for supplying grinding water, to the grinding water supply opening. The grinding water supply opening and the water supply line are not shown in the drawings.

Grinding stones which enable fine finishing of ground surface of the wafer 1 are desirably used for the grinding stones 316 which are secured on the cup wheel 315. For example, resinoid bonded grinding stones or vitrified bonded grinding stones, which have an abrasive grain diameter of 5 µm or less, can be used. If grinding stones which are relatively rough (which have an abrasive grain size of #320 or #600) are used for grinding of ground surface of wafer, damage will be deeply formed on the ground surface, and bending of the wafer will occur. Due to this, in the following processes, the bending may cause damage to the wafer. However, when a metal film is also formed on the rear surface of the peripheral reinforcing portion 5a, the following method is desirably used. That is, in initial grinding, the metal film is ground and removed by using rough grinding stones which have an abrasive grain size of about #320. Next, the rear surface which corresponds to the device region 4 is subjected to finish grinding which uses fine mesh grinding stones having an abrasive grain size of about #2000. In this case, rotation speed of the fine mesh grinding stones is about 2000 to 5000 rpm, and the finish grinding is performed at a speed of 0.1 to 0.5 μm/sec.

A cleaning water shower nozzle 320 (cleaning device) and an air nozzle 321 (cleaning device) are arranged next to each other at a boundary portion between the dicing tape applying section 200 and the wafer grinding section 300. The cleaning water shower nozzle 320 sprays cleaning water onto the wafer 1 disposed on the chuck table 201. The air nozzle 321 blows high pressure air onto the wafer 1 on which the cleaning water is sprayed, thereby removing the water therefrom. The nozzles 320 and 321 are long tubular nozzles which extend in the X direction, and they have plural spraying openings which are dotted in the longitudinal direction thereof and face downward. The cleaning water shower nozzle 320 is disposed on the side of the wafer grinding section 300, and the air nozzle 321 is disposed on the side of the dicing tape applying section 200. The nozzles 320 and 321 are provided so as to cross above the moving path of the table base 202 via a column (which is not shown in the drawings) which stands on the pedestal 11.

2-d Dicing Tape Carrying Section

The dicing tape carrying section 400 carries the dicing tape 31, which is shown in FIGS. 8A and 8B, to the dicing tape applying section 200. For example, the dicing tape 31 is an adhesive tape which has a base film and an adhesive coated on a surface of the base film. For example, the base film of the dicing tape 31 is composed of polyvinylchloride and has a thickness of about 100 μm. The adhesive is composed of acrylic resin and has a thickness of about 5 μm. A ring-shaped dicing frame 32 is applied to the adhesive surface of the dicing tape 31. The dicing frame 32 has an inner diameter larger than the diameter of the wafer 1. The dicing frame 32 is composed of a rigid member (for example, a metal plate). The wafer 1 is applied to the dicing frame 32, and handling (for example, carrying) of the wafer 1 is performed by holding the dicing frame 32.

The dicing tape carrying section 400 is equipped with a cassette 405, a drawing clamp 410, a carrying clamp portion 420, and a clamp driving mechanism 430. The cassette 405 is disposed at the front side of the Y direction on the pedestal 11. The drawing clamp 410 is disposed at the back side of the cassette 405 in the Y direction, and draws a dicing frame 32, which has one dicing tape, from the cassette 405. The carrying clamp portion 420 carries the dicing frame 32, which is held by the drawing clamp 410, to the wafer setting position of the dicing tape applying section 200. The clamp driving mechanism 430 moves the carrying clamp portion 420 in the X and Z directions.

Plural dicing frames 32 which have dicing tapes are stored and provided in the cassette 405 such that adhesive surfaces of the dicing tapes 31 face downward and are disposed horizontally. The clamp driving mechanism 430 is equipped with an X axis driving mechanism 460 and a Z axis driving cylinder 470. The X axis driving mechanism 460 has the same construction as that of the X axis driving mechanism 160 of the wafer supplying section 100. The cassette 405 moves the dicing frame 32 vertically by one step by using an elevating mechanism provided therein in the same manner as the wafer carrier 101. The dicing frame 32, which is moved to a predetermined drawing position, is drawn from the cassette 405 by the drawing clamp 410.

The drawing clamp 410 holds one dicing frame 32 provided in the cassette 405. The drawing clamp 410 is provided in a groove 411. The groove 411 is formed on the upper surface of the pedestal 11 and extends in the Y direction. The drawing clamp 410 is movable along the groove 411 and is reciprocated between the cassette 405 and the X axis driving mechanism 460 by using a driving mechanism which is not shown in the drawings. The drawing clamp 410, which holds the dicing frame 32 provided in the cassette 405, moves to the back side of the Y direction and draws the dicing frame 32 from the cassette 405 to a waiting position. The waiting position is positioned on a line extending from a line which connects the stop position of the wafer 1 and the setting position of the wafer 1. In this case, the stop position of the wafer 1 is a position at which the wafer 1 is stopped by the stopper 111 of the wafer supply section 100. The setting position of the wafer 1 is on the chuck table 201 of the dicing tape applying section 200. That is, the stop position of the wafer 1 on the wafer supply section 100, the setting position of the wafer 1 on the chuck table 201 of the dicing tape applying section 200, and the waiting position of the dicing frame 32 on the dicing carrying section 400 align in the X direction.

Figure 9A:
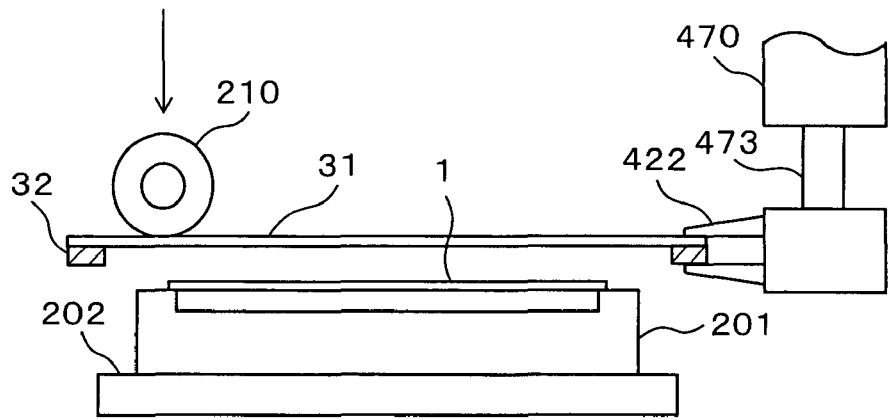
FIGS. 9A to 9C are side views which show a process in turn, in which the dicing tape is applied to the rear surface of the wafer by a pressing roller.
Figure 9B:
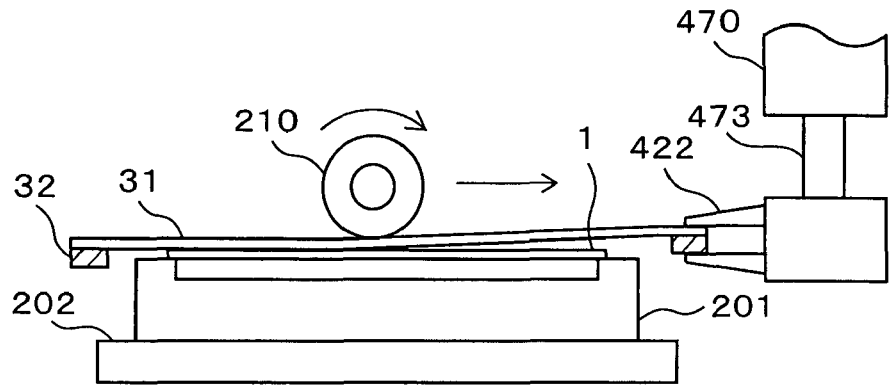
Figure 9C:
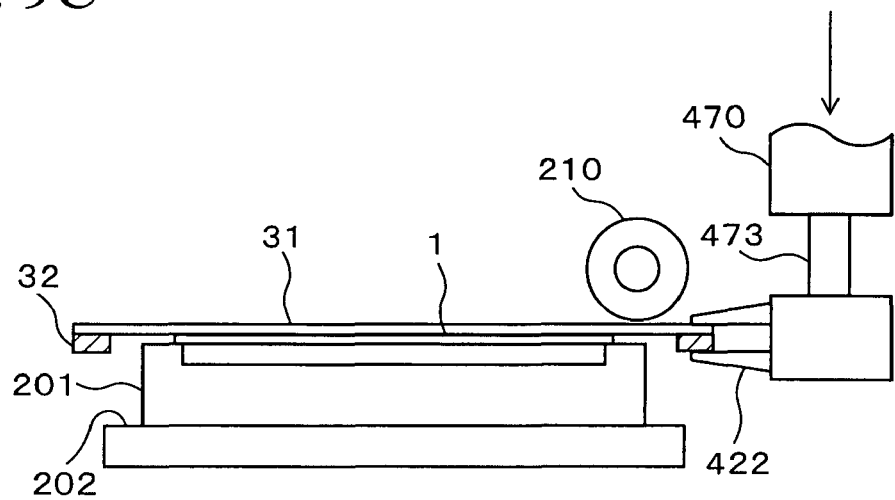

The X axis driving mechanism 460 is supported by a column 461, which stands on the pedestal 11, in a cantilever manner so as to cross above a back side portion of the groove 411 in the X direction. The Z axis driving cylinder 470 is moved in the X direction by the X axis driving mechanism 460 and extends in the Z direction. The Z axis driving cylinder 470 engages with the X axis driving mechanism 460 via a base plate 471. As shown in FIGS. 9A to 9C, the Z axis driving cylinder 470 has a piston 473 which is stretchable downwardly. The carrying clamp portion 420 has a stay 421 and a pair of carrying clamps 422. The stay 421 has an end portion which is secured at a lower end of the piston 473 of the Z axis driving cylinder 470, and the stay 421 extends in the X direction toward the dicing tape applying section 200. The carrying clamps 422 are provided on a surface of the stay 421, which faces the cassette 405, so as to be spaced a predetermined distance from each other in the X direction. The carrying clamp 422 holds the dicing frame 32 in the same manner as the drawing clamp 410. The carrying clamp portion 420 is moved together with the Z axis driving cylinder 470 by the X axis driving mechanism 460. The carrying clamp portion 420 is moved vertically (in the Z direction) by the piston 473 of the Z axis driving cylinder 470.

3. Action of Wafer Processing Apparatus

Next, an action example of the above constructed wafer processing apparatus 10 will be explained hereinafter.

One wafer 1 is drawn from the wafer carrier 101 of the wafer supply section 100 by the carrying belts 102. The rear surface of the wafer 1, which has the recess 4a formed thereon, faces upward. When the wafer 1 is carried to the stop position, at which the stopper 111 is provided, by the carrying belts 102, the wafer 1 is abutted to the stopper 111 and is stopped thereby. Next, the wafer hand 120 picks up the wafer 1.

As shown in FIG. 5A, the wafer hand 120 is moved directly above the wafer 1 by the wafer hand driving mechanism 140 in the condition that the leading end portion 122a of the hand pick 122 faces outwardly. As shown in FIG. 5B, the wafer hand 120 is moved downwardly by the Z axis driving mechanism 170, so that the lower surface of the hand pick 122 is positioned lower than the lower surface of the wafer 1. Next, the gear plate 123 is rotated by rotating of the hand shaft 124, in cooperation with the gear plate 123, and the hand pick 122 is rotated together with each pick shaft 125 by about 180 degrees. As shown in FIG. 5C, the leading end portion 122a of the hand pick 122 moves under the lower surface of the wafer 1. While this condition shown in FIG. 5C is maintained, as shown in FIG. 5D, the wafer hand 120 is moved upwardly, so that the wafer 1 is held upwardly. Since a peripheral portion of the surface of the wafer 1, which corresponds to the peripheral reinforcing portion 5a, is received by the hand pick 122, the wafer 1 can be carried without an excessive load being applied on the wafer 1.

Next, the wafer hand 120 is carried to the dicing tape applying section 200 by the X axis driving mechanism 160 of the wafer hand driving mechanism 140, and the wafer hand 120 is moved downwardly by the Z axis driving mechanism 170. As a result, the wafer 1 is mounted on the chuck table 201 of the dicing tape applying section 200 which is moved to the setting position beforehand and is under vacuum operation. The wafer 1 is chucked and held on the chuck table 201. The wafer hand 120 is moved upwardly from the chuck table 120 and is returned to the front side of the wafer carrier 101 in order to carry a next wafer 1. The wafer 1 is desirably concentric with the rotation center of the chuck table 201.

Next, the table base 202 is moved to the back side of the Y direction, so that the chuck table 201, which holds the wafer 1, is disposed at the grinding position. As shown in FIG. 6, while the wafer 1 is rotated together with the chuck table 201 and the cup wheel 315 of the grinding unit 310 is rotated at a high speed, the grinding stones 316 are pressed on the upper surface of the peripheral reinforcing portion 5a. At least the ring-shaped projection 6 is thereby ground and removed from the wafer 1 by the grinding stones 316. In this case, the outermost circumferential edge of locus of the rotated grinding stones 316 corresponds to the boundary between the device region 4 and the peripheral reinforcing portion 5a, so that only the ring-shaped projection 6 is removed. If necessary, the table base 202 is reciprocated in the Y direction, and the grinding stones 316 are relatively rolled in the Y direction, so that the ring-shaped projection 6 is ground. In addition to the removal of at least the ring-shaped projection 6, the peripheral reinforcing portion 5a may be ground and removed so as to be thinner than the device region 4.

In the above manner, after the reinforcing region 5a is processed, the operation of the grinding unit 310 is stopped, and the grinding unit 310 is moved upwardly. Next, the table base 202 is moved to the front side of the Y direction, so that the wafer 1 is disposed at the setting position. In the moving of the table base 202, the cleaning water is sprayed from the cleaning water shower nozzle 320 onto the wafer 1, so that ground waste and the like are cleaned. The high pressure air is blown from the air nozzle 321 so that the water clinging on the wafer 1 is removed.

When the peripheral reinforcing portion 5a of the wafer 1 is processed by the wafer grinding section 300 and the processed wafer 1 is carried to the setting position of the dicing tape applying section 200, in the dicing tape carrying section 400, one dicing frame 32 having the dicing tape 31 provided thereon is drawn from the cassette 405, and the dicing frame 32 is carried to the dicing tape applying section 200.

In the above action in the dicing tape carrying section 400, first, the drawing clamp 410 holds one dicing frame 32 provided in the cassette 405, and the drawing clamp 410 moves to the back side of the Y direction, thereby drawing the dicing frame 32 to the waiting position. Next, the carrying clamp portion 420 is disposed proximate to the back side of the Y direction of the dicing frame 32 positioned at the waiting position, and the piston 473 is moved downwardly. The carrying clamp 422 holds the dicing frame 32, and the holding of the dicing frame 32 by the drawing clamp 410 is stopped, so that the dicing frame 32 is received to the carrying clamp 422. Next, the dicing frame 32 is held upwardly by moving the piston 473 upwardly, and the carrying clamp portion 420 is moved to the setting position of the dicing tape applying section 200. Therefore, the dicing tape 31, which is provided on the dicing frame 32 held by the carrying clamp 422, is moved directly above the wafer 1 (of which the peripheral reinforcing portion 5a was processed) disposed on the dicing tape applying section 200. The dicing tape 31 is desirably disposed proximate to the wafer 1 so as to be spaced about several millimeters therefrom.

Next, the dicing tape 31 is applied on the rear surface of the wafer 1 by the pressing roller 210. As shown in FIG. 3, the pressing roller 210 is waiting in advance at the front side of the Y axis driving mechanism 250 in the Y direction. First, the pressing roller 210 is moved onto the dicing tape 31 by the Y axis driving mechanism 250. Next, as shown in FIG. 9A, after the pressing roller 210 is moved downwardly so as to abut to the surface of the dicing tape 31 by the Z axis driving mechanism 270, the pressing roller 210 is further moved downwardly, so that the end portion of the dicing tape 31 is pressed on the rear surface of the wafer 1 by the pressing roller 210. Next, as shown in FIGS. 9B to 9C, while the pressing roller 210 presses the dicing tape 31, the pressing roller 210 rolls toward the carrying clamp 422. As a result, the dicing tape 31 is pressed on the rear surface of the wafer 1, thereby being applied thereon. In this manner, the pressing roller 210 moves from one end side to the other end side on the rear surface of the wafer 1, and the dicing tape 31 is thereby pressed thereon, so that the dicing tape 31 can be applied without the air entering between the wafer 1 and the dicing tape 31.

In the final stage of the above application, an end portion of the dicing tape 31 is not applied on the wafer 1 due to a vertical gap between the dicing frame 32 and the wafer 1, thereby being rolled up. Due to this, it is difficult to apply the end portion of the dicing tape 31 on the wafer 1 smoothly. In order to solve this difficulty, for example, the Z axis driving cylinder 470 is elastically supported with respect to the base plate 471 so as to be movable vertically by using a cushion spring, so that the carrying clamp 422 moves downwardly in accordance with the dicing tape 31. Thus, the adhesion of the dicing tape 31 can be improved, so that the above technique is desirable.

After the applying of the dicing tape 31, the chucking and holding of the wafer 1 on the chuck table 201 is stopped by stopping the vacuum operation of the chuck table 201. Next, the dicing tape carrying section 400 operates in reverse of the above operation, so that the wafer 1 is provided into the cassette 405 together with the applied dicing tape 31 and the dicing frame 32. Finally, the wafer 1 having the dicing tape 31 applied thereon is cut along the predetermined division lines 2 by a cutting apparatus or the like, thereby being divided into plural semiconductor chips 3. The above grinding and removing of the peripheral reinforcing portion 5a by the wafer grinding section 300 is performed in order that the ring-shaped projection 6 on the rear surface of the wafer 1 is removed and the rear surface becomes flat and can be held by a typical chuck table when the wafer 1 is divided into plural semiconductor chips 3.

In the wafer processing method by the above wafer processing apparatus 10, the peripheral reinforcing portion 5a of the wafer 1 chucked and held on the chuck table 201 is processed by the grinding unit 310 so that at least the ring-shaped projection 6 is removed. Next, the wafer 1 is returned to the setting position of the dicing tape applying section 200. While the wafer 1 is held on the setting position of the chuck table 201, the dicing tape 31 is applied on the rear surface of the wafer 1. In this manner, while the wafer 1 after the grinding is not separated from the chuck table 201 and this condition of the wafer 1 is maintained, the dicing tape 31 is applied on the wafer 1, so that the wafer 1 can be transferred to the next process via the dicing frame 32 without directly contacting the wafer 1. Therefore, the wafer 1, which is thinned by the removal of the peripheral reinforcing portion 5a and may be thereby not easily handled, can be reliably transferred without damage thereto.

In the above embodiment, the dicing tape 31, which has the dicing frame 32 integrally applied thereon, is applied on the rear surface of the wafer 1. Alternatively, the dicing tape 31 and the dicing frame 32 separated from each other may be used, the dicing tape 31 may be applied on the rear surface of the wafer 1, and then the dicing frame 32 is applied on the dicing tape 31. In this case in which the dicing tape 31 and the dicing frame 32 are separated from each other, the wafer 1 may be disposed inside the dicing frame 32 mounted on the chuck table 201, the wafer 1 and the dicing frame 32 may be positioned on the same surface, and the dicing tape 31 may be applied on the wafer 1 and the dicing frame 32, so that the dicing frame 32 and the wafer 1 can be simultaneously applied on the dicing tape 31. In this case, the size relationship of the dicing frame 32 and the chuck table 201 should be determined such that the outer diameter of the chuck table 201 is larger than the inner diameter of the dicing frame 32 and the dicing frame 32 can be mounted on the chuck table 201. In addition, the chucked surface on which the dicing frame 32 is mounted is desirably formed outside a wafer chucking area of the center portion of the chuck table 201 so as to have the same surface. Although the dicing tape 31 and the dicing frame 32 separated from each other can be provided on the wafer 1 in the above manner, the case in which the dicing tape 31 and the dicing frame 32 are integrally applied to each other is advantageous since the processing is simplified.

In the above embodiment, the grinding method which uses the grinding stones 316 is used for the removing of the peripheral reinforcing portion 5a of the wafer 1, and the grinding method is not limited thereto. For example, instead of the grinding stones 316, a thin disc-shaped cutting blade may be provided to the spindle 313 of the grinding unit 310, and the ring-shaped projection 6 of the peripheral reinforcing portion 5a can be cut off by this cutting blade.

Figure 10:
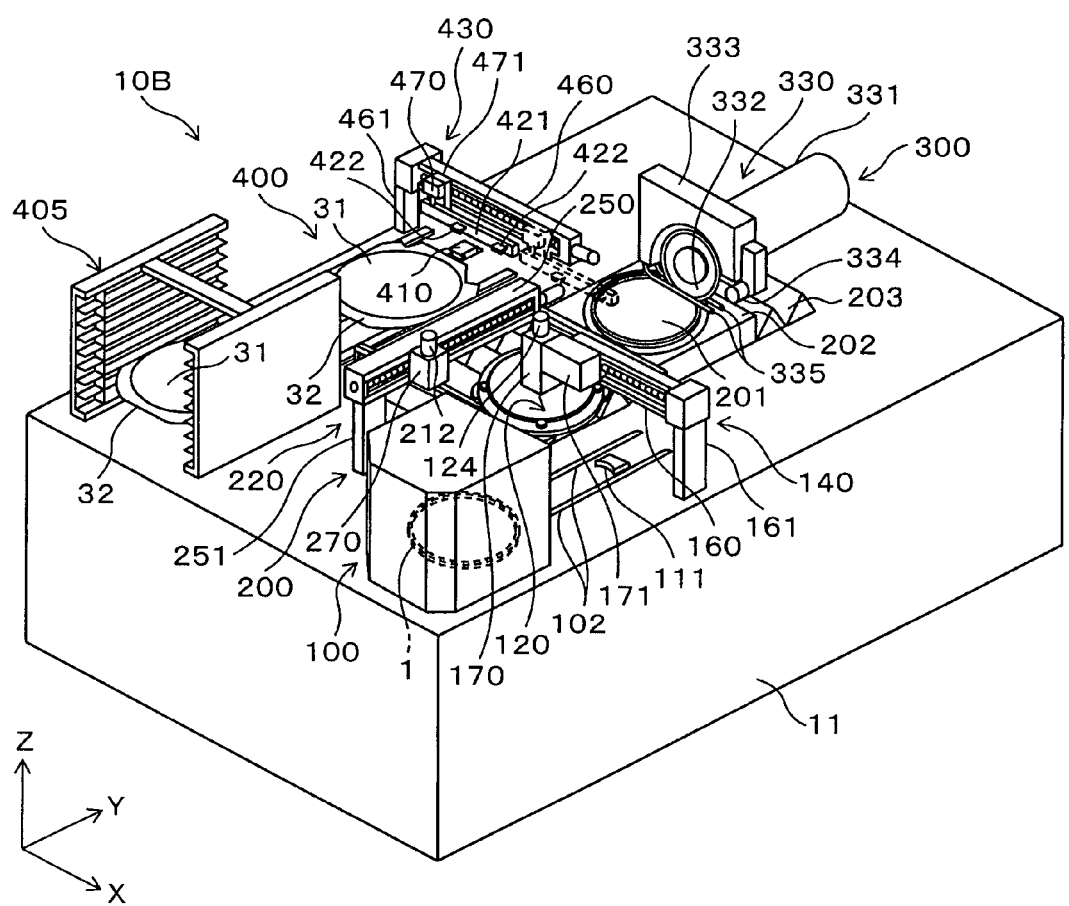
FIG. 10 is an overall perspective view of a wafer processing apparatus of another embodiment according to the present invention.
Figure 11:
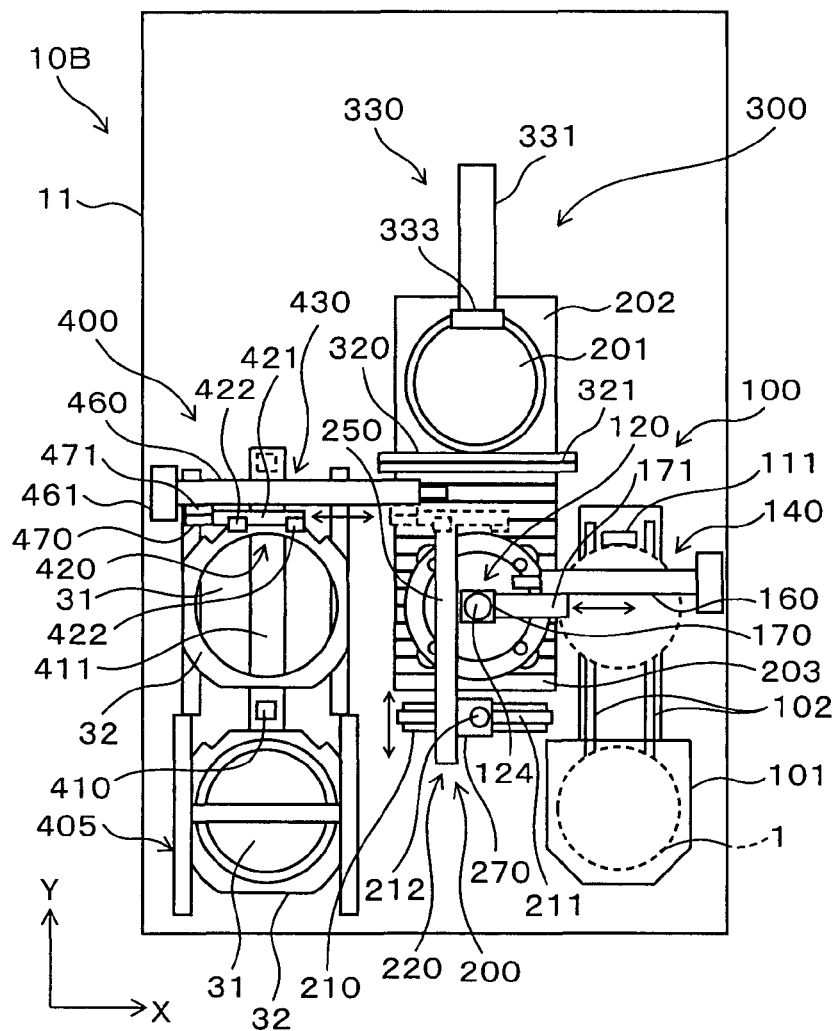
FIG. 11 is a plan view which shows the wafer processing apparatus shown in FIG. 10.

Alternatively, for example, the boundary between the peripheral reinforcing portion 5a and the device region 4 is cut by a cutting blade which has a rotation axis parallel to the upper surface of the chuck table 201, so that the ring-shaped projection 6 of the peripheral reinforcing portion 5a is cut off. For example, a cutting blade, which is thick and has a thickness of 1 to 3 mm, is provided to a rotation shaft parallel to the upper surface of the chuck table 201. In this case, the upper surface of the ring-shaped projection 6 is cut by the cutting blade, and then the cutting blade is rolled in a direction of the rotation shaft, so that the ring-shaped projection 6 of the peripheral reinforcing portion 5a is ground and removed. FIGS. 10 and 11 show a wafer processing apparatus having the above cutting blade of another embodiment according to the present invention.

4. Another Embodiment of Wafer Processing Apparatus

As shown in FIGS. 10 and 11, in a wafer grinding apparatus 10B, a cutting unit (peripheral reinforcing portion removing device) 330 is provided instead of the above wafer grinding unit 310. The cutting unit 330 is equipped with a cylindrical spindle housing 331 and a cutting blade 332. The spindle housing 331 is disposed at the back side (upper side in FIG. 11) of the chuck table 201 in the Y direction. In this case, the chuck table 201 is positioned at the grinding position such that the axial direction of the chuck table 201 is parallel to the Y direction. The cutting blade 332 is provided at the end portion of the spindle housing 331 which is proximate to the chuck table 201.

The cutting blade 332 is secured at a spindle (not shown in the drawings) which is a rotation driving mechanism provided in the spindle housing 331 so as to be coaxial therewith. The cutting unit 330 has a frame (not shown in the drawings) which is provided on the pedestal 11. The spindle housing 331 of the cutting unit 330 is supported by the frame so as to reciprocate in the Y direction and to move vertically in the Z direction while the axial direction of the spindle housing 331 is parallel to the Y direction and crosses the rotation axis of the chuck table 201. A driving mechanism (not shown in the drawings) is provided on the frame of the cutting unit 330 for moving the cutting unit 330 in the above directions. The movement range of the cutting unit 330 in the Y direction is set such that the cutting blade 332 can cut at least the peripheral reinforcing portion 5a positioned at the back side of the Y direction on the wafer 1 which is positioned at the grinding position. Alternatively, the movement range thereof may be set such that the cutting blade 332 can cross the wafer 1.

A blade cover 333 is provided at an end portion of the spindle housing 331 which is proximate to the cutting blade 332. Cutting water nozzles 334 and 335 are provided on the blade cover 333, and they supply cutting water onto processed points of the wafer 1. The cutting water is used for lubricating, cooling, cleaning, and the like during the cutting.

Figure 12:
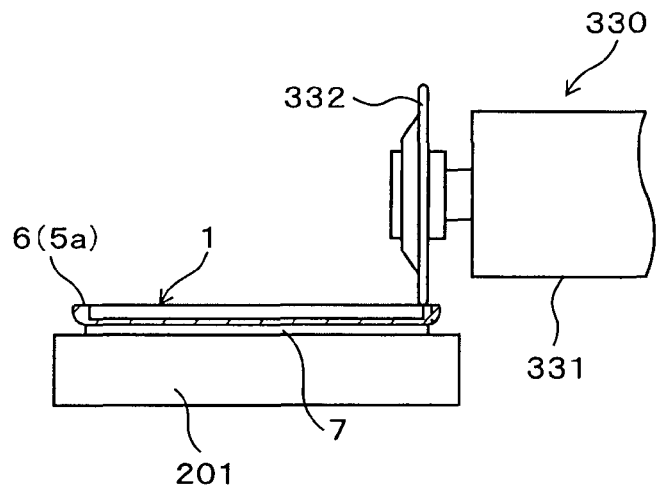
FIG. 12 is a side view which shows a condition in which a peripheral reinforcing portion of a wafer is cut by a cutting blade of the wafer processing apparatus of the another embodiment according to the present invention.

In the cutting unit 330, as shown in FIG. 12, while the cutting blade 332 is rotated at a high speed, the cutting unit 330 is moved downwardly to the wafer 1 disposed on the chuck table 201 which is moved to the grinding position. The cutting blade 332 cuts the ring-shaped projection 6 of the peripheral reinforcing portion 5a, and it repeatedly reciprocates in the Y direction. As a result, at least the ring-shaped projection 6 of the peripheral reinforcing portion 5a can be cut and removed. For example, the position of the cutting unit 330 in the Y direction is a position at which the cutting blade 332 cuts the back side of the Y direction on the peripheral reinforcing portion 5a.

FIGS. 13A to 13H show an action example of the cutting blade 332 which cuts the peripheral reinforcing portion 5a. The order of the action will be explained hereinafter. In this case, the cutting blade 332 has an edge thickness (for example, about 1 to 3 mm as described above) which is almost half of the width of the peripheral reinforcing portion 5a.

Figure 13A:
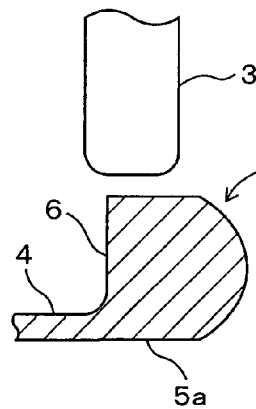
FIGS. 13A to 13H are side views which show an example of the action of the cutting blade in turn, the cutting blade cutting a peripheral reinforcing portion of the wafer.
Figure 13B:
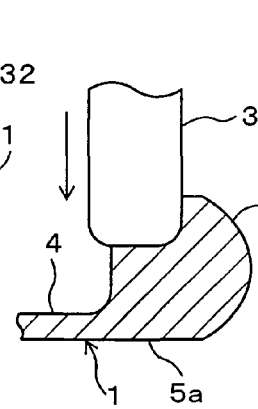
Figure 13C:
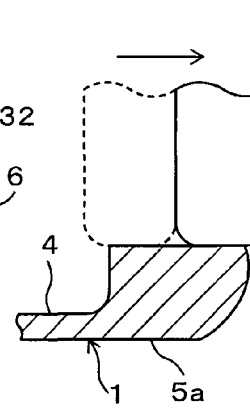
Figure 13D:
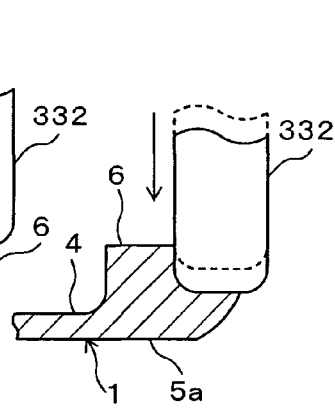
Figure 13E:
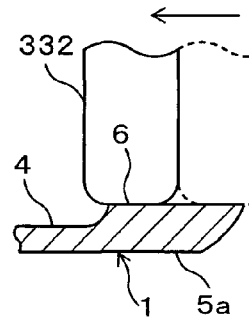
Figure 13F:
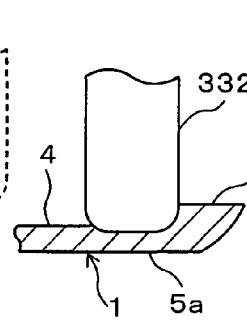
Figure 13G:
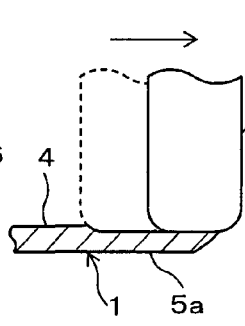
Figure 13H:
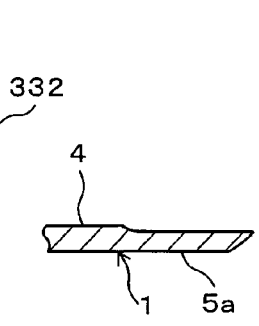

As shown in FIGS. 13A and 13B, first, the cutting blade 332 moves from the upside, and it cuts an inner circumferential side of the ring-shaped projection 6 of the peripheral reinforcing region 5a. As shown in FIG. 13C, the cutting blade 332 moves to an outer circumferential side of the ring-shaped projection 6 along the rotation axis of the cutting blade 332, so that the height of the ring-shaped projection 6 is reduced by one step. Next, as shown in FIG. 13D, the cutting blade 332 moves downwardly, so that the cutting blade 332 cuts the outer circumferential side of the ring-shaped projection 6. As shown in FIG. 13E, the cutting blade 332 moves to the inner circumferential side of the ring-shaped projection 6, so that the height of the ring-shaped projection 6 is further reduced by one step. Next, as shown in FIG. 13F, the cutting blade 332 moves downwardly, and it cuts the inner circumferential side of the ring-shaped projection 6 slightly more deeply than the device region 4. As shown in FIG. 13G, the cutting blade 332 moves to the outer circumferential side of the ring-shaped projection 6, it cuts the outer circumferential portion, and it moves away from the wafer 1. As shown in FIG. 13H, the wafer 1 is obtained such that the peripheral reinforcing region 5a is thinner than the device region 4. The whole horizontal reciprocation direction of the cutting blade 332 is the horizontal direction (Y direction) which extends along the rotation axis of the cutting blade 332. The cut direction of the cutting blade 332 is the Z direction (vertical direction). In the cutting of the wafer 1, the appropriate amount of the cutting water is supplied from the cutting water nozzles 334 and 335 onto the processed points of the wafer 1.

The wafer 1 of which the peripheral reinforcing portion 5a was processed in the above manner is returned to the dicing tape applying section 200 in the same manner as in the above embodiment. The dicing tape 31 having the dicing frame 32 applied thereon is applied on the rear surface of the wafer 1.

FIGS. 13A to 13H show one example of the processing method of the peripheral reinforcing portion 5a by the cutting unit 330. In another processing method, the cutting blade 332 has a width which is equal to or wider than the width of the ring-shaped projection 6. The edge of the cutting blade 332 is abutted to the upper surface of the ring-shaped projection 6, and the cutting blade 332 cuts it downwardly. In this method, the cutting blade 332 presses the entire width of the upper surface of the ring-shaped projection 6 downwardly so as to reduce the height of the ring-shaped projection 6. In the above one downward movement of the cutting blade 332, the ring-shaped projection 6 can be removed. In an alternative processing method, the movement amount of the cutting blade 332 in the wafer thickness direction (Z direction) is set such that the edge of the cutting blade 332 contacts the rear surface of the device region 4. One side surface of the cutting blade 332 cuts the outer circumferential side surface of the ring-shaped projection 6 and removes the ring-shaped projection 6 in the width direction thereof (Y direction). In this method, the cutting blade 332 presses the whole height of the ring-shaped projection 6 from the outer circumferential side surface to the inner side of radius direction, and it moves in the width direction. In the above one movement of the cutting blade 332 in the width direction, the ring-shaped projection 6 can be removed.

What is claimed is:

1. A processing method for a wafer, comprising:
preparing a wafer which has a device region having plural devices formed on a surface of the wafer; and a peripheral reinforcing portion which is integrally formed around the device region by forming of a recess at a center portion of a rear surface of the wafer by grinding and removing of the center portion thereof and has a projection projecting outwardly on a rear surface of the wafer;
removing at least the projection of the peripheral reinforcing portion of the wafer; and
transferring the wafer after the removing,
wherein in the removing, while the wafer is held on a holding table such that the rear surface of the wafer is exposed and the surface of the wafer closely contacts the holding table, at least the projection of the peripheral reinforcing portion is removed,
after the removing of at least the projection, while the wafer is held on the holding table, a holding tape is applied to the rear surface of the wafer and the holding tape is supported by a frame, and
in the transferring, the wafer having the holding tape applied thereon is separated together with the frame from the holding table and is transferred together with the frame.

2. A processing method for a wafer according to claim 1, wherein the frame is integrally applied to the holding tape beforehand.

3. A processing method for a wafer according to claim 1, wherein a metal film is provided to a region of the rear surface which corresponds to the device region.

4. A processing method for a wafer according to claim 1, wherein after the removing of at least the projection of the peripheral reinforcing portion of the wafer, while the wafer is held on the holding table, the wafer is cleaned, and
after the cleaning of the wafer, the holding tape is applied to the rear surface of the wafer.

* * * * *